United States Patent [19]

Bauer et al.

[11] Patent Number: 4,828,872
[45] Date of Patent: May 9, 1989

[54] METHOD AND APPARATUS FOR THE REACTIVE VAPOR DEPOSITING OF METAL COMPOUNDS

[75] Inventors: Volker Bauer; Albert Feuerstein, both of Neuberg; Klaus Hartig, Ronneburg; Gerhard Kienel, Hanau; Helmuth Lämmermann, Alzenau; Wolfgang Zirkel, Linsengericht, all of Fed. Rep. of Germany

[73] Assignee: Leybold-Heraeus GmbH, Cologne, Fed. Rep. of Germany

[21] Appl. No.: 906,225

[22] Filed: Sep. 11, 1986

[30] Foreign Application Priority Data

Aug. 11, 1986 [DE] Fed. Rep. of Germany ....... 3627151

[51] Int. Cl.$^4$ .............................................. B05D 3/06
[52] U.S. Cl. ........................................ 427/39; 427/42; 427/47; 118/723; 118/726; 204/192.31
[58] Field of Search ...................... 204/192.31, 192.11, 204/298; 427/35, 38, 39, 47, 49, 50, 42; 118/720, 722, 723, 724, 725, 726; 219/121 EE; 250/425, 427

[56] References Cited

U.S. PATENT DOCUMENTS

| | | | |
|---|---|---|---|
| 3,454,814 | 7/1969 | Mancebo | 219/121 EE X |
| 3,467,057 | 9/1969 | Tamura et al. | 118/723 |
| 3,756,193 | 9/1973 | Carmichael et al. | 118/726 |
| 4,514,437 | 4/1985 | Nath | 118/723 X |

OTHER PUBLICATIONS

Bunshah et al., "Activated . . . Compounds", J. Vac. Sci. Technol., vol. 9, No. 6, Nov., Dec. 1972, pp. 1385-1388.

Primary Examiner—Nam X. Nguyen
Attorney, Agent, or Firm—Felfe & Lynch

[57] ABSTRACT

A method and apparatus is disclosed for the reactive deposition of vapors of metal compounds onto substrates by the evaporation of at least one metal by means of an electron beam in an atmosphere consisting of the reaction gas, at pressures of no more than $10^{-1}$ mbar. An electrode positively biased with respect to ground and having an acceleration voltage of at least 20 kV is disposed in the area of the vapor stream flowing to the substrate. The metal vapor is produced in an internal chamber which surrounds the evaporator and has a masked orifice opposite the substrate. The reaction gas is introduced into the internal chamber and the metal vapor and reaction gas are guided by the masked orifice toward the substrate.

9 Claims, 4 Drawing Sheets

METHOD AND APPARATUS FOR THE REACTIVE VAPOR DEPOSITING OF METAL COMPOUNDS

FIELD OF THE INVENTION

The invention relates to a method for the reactive vapor depositing of metal compounds on substrates by means of an electron beam in an atmosphere of the reaction gas at pressures of no more than $10^{-1}$ mbar, while an electrode positively biased with respect to ground is disposed in the area of the vapor stream flowing to the substrate.

BACKGROUND OF THE INVENTION

The metals in question are preferably those which yield so-called hard substances, such as titanium, zirconium tantalum, vanadium and hafnium, for example. The hard substances are compounds of at least one of these metals with nitrogen (nitrides), carbon (carbides) and with carbon and nitrogen simultaneously (so-called carbonitrides). The method, however, is also suitable for the reactive vapor deposition of other metals, which for example are reacted with oxygen to oxides.

A method of the kind described above is disclosed in the article by Bunshah and Raghuram, entitled "Activated Reactive Evaporation Process for High Rate Deposition of Compounds" published in J. Vac. Sci. Technol., vol. 9, No. 6, November–December 1972, pages 1385 to 1388. In the method therein described, the metal is vaporized directly in the vacuum chamber by means of an electron beam of relatively low acceleration voltage (10 kV). Likewise, a wire-like electrode biased positively with respect to ground, e.g., to a voltage between 80 and 200 volts, is situated directly in the vapor stream. In the operation of this apparatus, the electron beam serves not only for the evaporation of the metal, but also as an electron donor, while the positive electrode attracts negative charge carriers, thereby increasing the ionization probability, and is surrounded directly by a glow discharge. The known method and apparatus, however, have not progressed beyond their use on a laboratory scale, since the evaporation rate cannot be increased to the desired level for large-scale industrial processes. All attempts to increase the evaporation rate by increasing the beam current and hence the beam power have failed because the reaction no longer was stoichiometric, even though the nozzle for the injection of the reaction gas discharges directly above the evaporation zone. The depositing rates locally were between 4 and 9.7 micrometers per minute, but could not be distributed over a larger surface, and the precipitated coatings contained to an appreciable extent metals which did not participate in the reaction.

In the coating of materials with hard substances on a large industrial scale, therefore, the method of magnetic-field-supported cathode sputtering has been used almost exclusively, but in that case rates of deposit of about 1 to 1.5 micrometers per minute cannot be exceeded substantially, if at all.

The invention is therefore addressed to the problem of improving a method of the kind described in the beginning so that coatings containing stoichiometrically reacted components of metals and gases will be obtained at high deposit rates, and enabling the method to be practiced on a large industrial scale under stable conditions of operation.

SUMMARY OF THE INVENTION

The solution of the stated problem is accomplished according to the invention, in the method described in the beginning, by the fact that (a) the metal vapor is produced in an inner chamber which surrounds the evaporator and has a masked orifice opposite the substrate, (b) the reaction gas is introduced into the inner chamber, (c) metal vapor and reaction gas are guided by the masked orifice toward the substrate, (d) the electron beam in the inner chamber is made to interact with the metal vapor and the reaction gas for ionization purposes, while an acceleration voltage of at least 20 kV is selected, and that (e) the negative charge carriers formed in the internal chamber and discharged into the latter are drawn through the diaphragm by the electrode which is disposed beyond the mask outside of the vapor stream and is biased positively with respect to ground, thereby producing an intense glow discharge burning in the area of the diaphragm opening and the electrode.

In the method of the invention, all of features (a) to (e) interpenetrate and promote one another. It can be assumed that the intermingling of vapor and reaction gas in the inner chamber, and to some extent also of the metal vapor and reaction gas, in conjunction with the electron beam discharged into the inner chamber, results in an extremely great ionization which leads to the release of additional electrons. Since the acceleration voltage of the electron beam, of 20 kV and more, preferably of about 30 to 40 kV, is greater than in the state of the art, an extraordinarily "stiff" electron beam is produced, which is not deflected by the magnetic field of the anode current and therefore remains stable. By the drawing off of the negative charge carriers through the diaphragm constricting the gas and vapor stream, the ionization probability is increased in the area of the diaphragm and electrode. In a process which was performed with the working parameters stated further below, it has thus been possible to produce a glowing white plasma radiating strongly in the visible range, which made it possible to achieve the desired complete reaction between the metal vapor and large amounts of gas. In the manner thus described, deposition rates of 5.0 micrometers per minute were easily attained, which is by no means the limit.

Inasmuch as the positively biased electrode lies outside of the vapor stream, it is at least not directly struck by the vapor stream, so that it for this reason, too, it remains functional for a long period of time. The condition that it be "outside of the vapor stream" is satisfied substantially if the electrode in question, considered in projection, does not reach into the diaphragm opening, but is at least congruous with the edge of the diaphragm opening.

It is advantageous for the inner chamber and the evaporating crucible to be at the same potential, preferably at ground potential. This can be accomplished, for example, by a metallic junction of good electrical conductivity between the two parts.

It is furthermore advantageous for the electrode situated beyond the diaphragm to be biased at $+5$ to $+100$ V, preferably $+20$ to $+40$ V.

While the substrate can be kept basically at ground potential, it is advantageous to apply to the substrate a voltage of −50 to −2000 V, in order thereby to achieve a kind of ionic implantation of positive charge carriers.

The invention furthermore relates to an apparatus for the practice of the method described in the beginning, which has an external vacuum chamber, an evaporating crucible with an electron gun to bombard the material in the evaporating crucible with an electron beam, and an electrode disposed between the evaporating crucible and the substrate, to which a positive potential with respect to ground can be applied.

For the solution of substantially the same problem, such an apparatus is characterized according to the invention by the fact that (a) the space above the evaporating crucible is surrounded by an inner chamber which has an opening for the entry of the electron beam and has a diaphragm opening toward the substrate, (b) the inner chamber is provided with a system for feeding a reaction gas, (c) beyond the diaphragm opening an electrode which does not lie in the surface of projection of the diaphragm opening is disposed in an insulated manner and connected to a voltage source having an output voltage that is positive with respect to ground.

It is especially advantageous for the inner chamber to be of parallelipipedal shape and be placed with its open bottom down on the evaporating crucible, for one of the four vertical sidewalls of the inner chamber to have the opening for the entry of the electron beam, for the diaphragm opening to be in the roof of the inner chamber, and for the electrode to be insulatedly mounted in the roof of the inner chamber.

The result is a very compact construction in which the inner chamber is simultaneously the bearer of the electrode facing the substrates.

On account of the high discharge power, especially in the area of the diaphragm opening and the electrode, it is especially desirable for the electrode of frame-like construction to have a cooling passage.

It is futhermore advantageous for pole faces of a deflection magnet system to be disposed on both sides of the inner chamber, and for at least the middle of the electron beam to to be in the plane of symmetry between the two pole faces.

The term, "middle" of the electron beam is to be understood as a point equidistant from the two end positions of the periodically deflected or oscillating electron beam. The oscillation of the electron beam is desirable especially in order to be able to sweep a larger area of the material being evaporated.

BRIEF DESCRIPTION OF THE DRAWINGS

An embodiment of the subject matter of the invention will now be explained with the aid of FIGS. 1 to 4.

DETAILED DESCRIPTION OF PREFERRED EMBODIMENT

Figure 1:
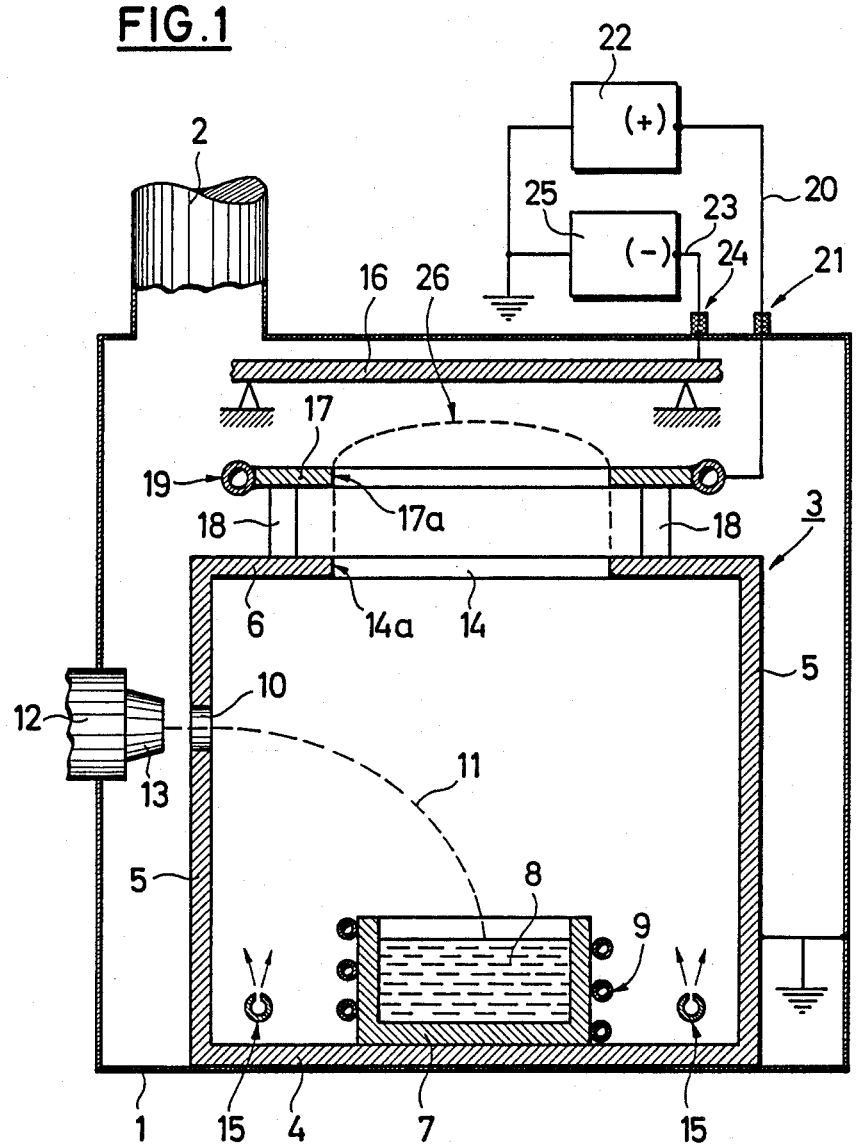
FIG. 1 is a diagrammatic representation of a cross sectional view of an apparatus according to the invention.

In FIG. 1 there is represented a vacuum chamber 1 which is evacuated by a pump, not shown, through a suction connection 2. In the outer vacuum chamber 1 there is an inner chamber 3 which has a horizontal bottom 4, four vertical side walls 5 and a horizontal roof 6. On the bottom 4 rests an evaporating crucible 7 which contains the molten material 8 that is to be evaporated, and which is surrounded by a cooling coil 9. In the left side wall 5 there is an opening 10 for the entry of an electron beam 11 which is deflected on an arcuate path onto the surface of the material being evaporated 8.

Figure 2:
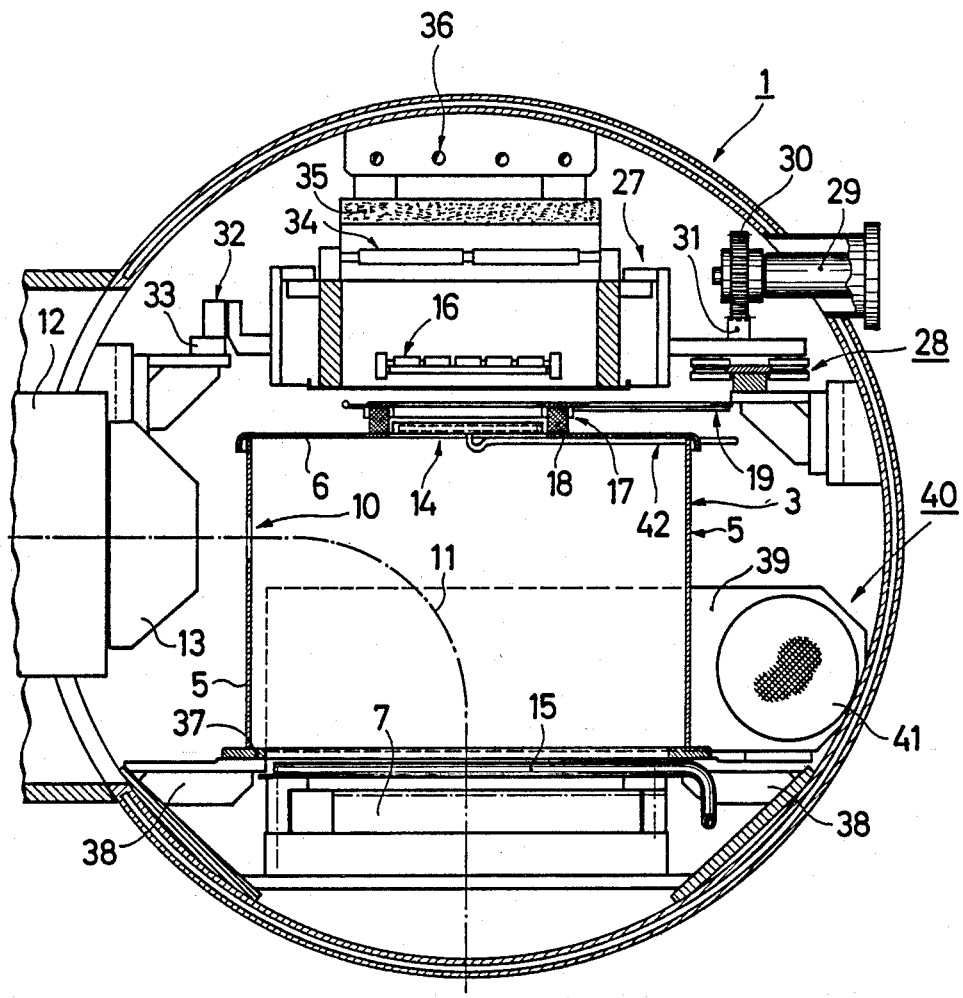
FIG. 2 is a vertical section through an apparatus actually constructed.

The beam deflection means will be further explained in conjunction with FIG. 2. In back of the entry opening 10 is an electron gun 12 with a deflection system 13 by which the electron beam 11 is periodically deflected according to a given pattern established by a program onto the surface of the material being evaporated 8.

The roof 6 of the inner chamber is constructed in the manner of a diaphragm, i.e., it has an opening 14 whose cross section is markedly smaller than the total cross section of the inner chamber 3. In the lower part of the inner chamber 3 is a feed system 15 which consists of two straight, perforated pipes which are perpendicular to the plane of the drawing and serve to deliver the reaction gas. The vapor of material 8 formed by the action of the electron beam 11, and the gas delivered by the feed system 15, are guided through the diaphragm opening 14 onto a substrate 16 which is stationary or movable over the diaphragm opening 14. In the present case the substrate 16 is represented as stationary.

Beyond the diaphragm opening 14, i.e., between the inner chamber roof 6 and the substrate 16 there is an electrode 17 which is not within the area of projection of the diaphragm opening 14, and which is supported by insulators 18 on the chamber roof 6. The inside edges 14a of the diaphragm opening 14 form a rectangle; the same is also true of the inside edges 17a of the electrode 17, which consequently forms a rectangular frame. The arrangement is such that the inside edges 14a and 17a are substantially in alignment with one another, although slight misalignments are not critical. The electrode 17 is surrounded on its outside edges by a cooling passage 19 which serves to carry cooling water.

While the inner chamber 3, like the outer vacuum chamber 1 and the evaporating crucible 7, is at ground potential, the electrode 17 is connected by a line 20 and an insulated lead-through 21 to a voltage source 22 which applies to it a positive potential with respect to ground. While it is possible to have the substrate 16 also at ground potential, it can also be connected by a line 23 and an insulated lead-through 24 to a direct-current source 25. The described potential difference between the electrode 17 and the inner chamber 3 produces in the area of the diaphragm opening 14 an extremely intense glow discharge whose upper and lateral limits can be indicated approximately by the broken line 26.

By way of example, the distance between the upper surface of the roof 6 and the upper surface of the electrode 17 can amount to 31 mm, and the distance between the upper surface of the electrode 17 and the bottom of the substrate can be from 16 to 34 mm.

In FIG. 2, parts identical to those in FIG. 1 or serving the same function are provided with the same reference numbers. In addition, the following is shown:

A plurality of substrates 16 are fastened to a movable substrate holder 27 which can move over the diaphragm opening on a roller and track system 28 perpendicularly to the plane of the drawing. A drive motor 29, a pinion 30 and a rack 31 serve for the (periodically reciprocating) drive. The opposite side of the substrate holder 27 is supported by a wheel 32 on a track 33. Above the substrates 16 is a heating means 34 consisting of graphite rods for the heating of the substrates 16, thermal insulation 35, and a flexible cable system 36 to feed the heating current and (if necessary) the negative bias for the substrates 16.

It can furthermore be seen that the inner chamber 3 has an open bottom 37 resting on cantilevers 38 in the bottom part of the vacuum chamber 1. Directly underneath it, inserted into the bottom 37, is the evaporating crucible 7.

On both sides of the inner chamber 3 are pole faces 39, represented partially in broken lines, which are formed by the inner sides of the legs of a U-shaped deflecting magnet system 40. The two legs are joined together by a yoke 41 on which a magnet coil is wound, which is not shown here. The deflecting magnet system deflects the electron beam 11 onto the curved path shown in FIGS. 1 and 2 and aims it at the material being evaporated 8.

FIG. 2 shows a second system 42 for feeding a second reaction gas, if such is needed.

Figure 3:
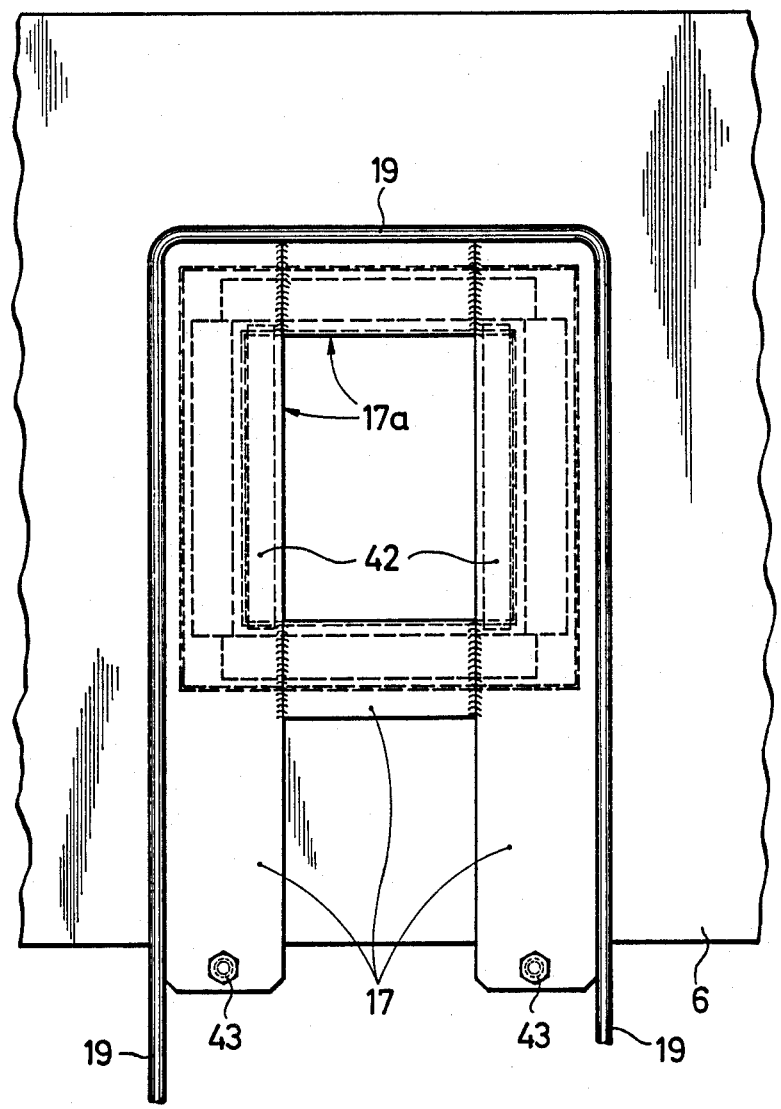
FIG. 3 is a top view of the inner chamber with the electrode above it.

FIG. 3 is a plan view of the electrode 17, consisting of copper, with the cooling passage 19 surrounding it on three sides. Screw terminals 43 serve for the connection of the power supply. The inside dimensions of the electrode 17, given by the distance between the inside edges 17a disposed in parallel pairs, amount to 90×135 mm. The view represented in FIG. 3 would be obtained by imagining the substrate holder 27 and all other components removed from FIG. 2.

Figure 4:
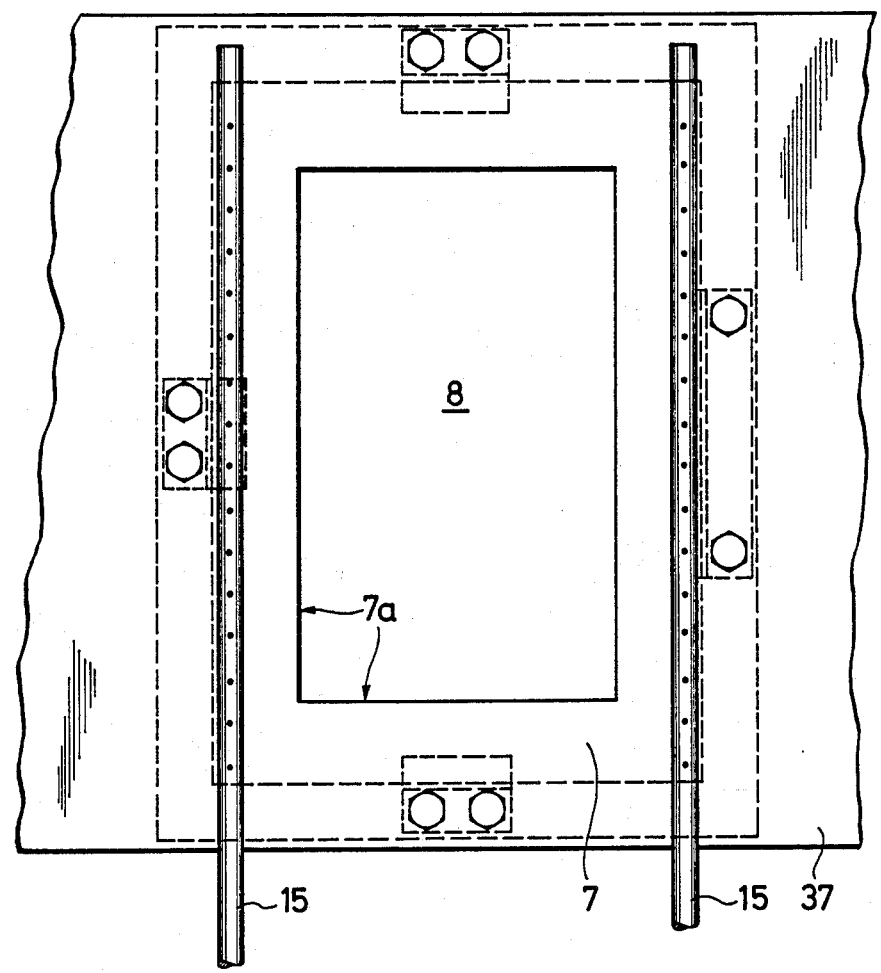
FIG. 4 is a view of the bottom part of the inner chamber containing the system for feeding the reaction gas.

FIG. 4 is a plan view of the evaporating crucible 7 with the material 8 which is to be evaporated. On both sides of the mouth of the crucible, indicated by the inner edges 7a, runs the reaction gas system 15, consisting of perforated sections of tubing. The view represented in FIG. 4 could be obtained by imagining the inner chamber 3 and all the components above it to have been removed.

EXAMPLE

In an apparatus with the details according to FIGS. 2 to 4 strips of stainless steel were disposed as the substrates 16. The material to be evaporated was titanium. The pressure in the outer vacuum chamber 1 was established at about 10-2 mbar by the dosed admission of nitrogen (N2). The reactive evaporation process was started by bombarding the material 8 with an electron beam 11 with an accelerating voltage of 35 kV and a beam current of 1.7 A. The voltage at the electrode 17 was +30 V, while an anode current of 200 A was established at the electrode. The negative bias on the substrates was $-100$ V. The coating process was continued for a period of 50 seconds with repeated moving back and forth of the substrates. The coating rate computed on this basis amounted to 5.0 micrometers per minute. The gold-colored coating had a hardness of HV=1200 kp/mm$^2$ with an excellent strength of adhesion which was not overcome even by sharp bending of the stainless steel strips.

It was found by scanning electron microscopy that the coating was extremely dense and free of radial growth, in contrast to the results found in studies of the process according to the state of the art.

We claim:

1. A method for depositing a vapor stream on a substrate comprising:

(a) producing a metal vapor in an inner vacuum chamber disposed within an outer vacuum chamber of an evaporation means by directing an electron beam onto a metal located in the inner vacuum chamber, the said inner chamber having a ground potential;

(b) introducing a reactive gas having a pressure of no more than $10^{-1}$ mbar into the inner vacuum chamber, the reactive gas and the metal vapor combining to form a vapor stream;

(c) ionizing the vapor stream with the electron beam in the inner vacuum chamber to form negative charge carriers in the vapor stream, the electron beam having an acceleration voltage of at least 20 kV to form negative charge carriers in the vapor stream; and (d) drawing the negative charge carriers from the inner vacuum chamber through a masked orifice and a diaphragm of an electrode toward the substrate so as to produce an intense glow discharge in an area of the diaphragm of the electrode, the electrode being disposed between said masked orifice and said substrate and being positively biased with respect to the ground potential of the inner chamber.

2. The method according to claim 1, wherein the ionizing step comprises: biasing the acceleration voltage of the electron beam in a range of $+5$ to $+100$ volts.

3. The method according to claim 2, wherein the ionizing step further comprises: biasing the acceleration voltage of the electron beam in a range of $+20$ to $+40$ volts.

4. The method according to claim 1, wherein the drawing step comprises: biasing the substrate with a voltage in a range of $-50$ to $-2000$ volts.

5. An apparatus for depositing a vapor stream on a substrate comprising:

(a) an evaporator having an inner vacuum chamber disposed within an outer vacuum chamber, said inner vacuum chamber having one end containing an evaporating crucible and on opposite end defining an opening which is masked at an opposing end;

(b) electron gun means extending through an outside wall of the evaporator for directing an electron beam through an opening in the inner vacuum chamber wall and into the evaporating crucible;

(c) a substrate disposed in the outer vacuum chamber and connected to a voltage means for biasing the substrate relative to a ground potential;

(d) an electrode disposed in the outer vacuum chamber between the masked opening of the inner vacuum chamber and the substrate, the electrode being biased to a positive potential with respect to a ground potential; and (e) gas feeding means connected to the inner chamber for introducing a reaction gas into the inner chamber.

6. The apparatus according to claim 5, wherein the inner chamber has a parallelipipedal shape defined by vertical side walls, a bottom wall with an opening below the evaporating crucible and a roof having inner edges defining a diaphragm opening; and said electrode being affixed in an insulated manner to the roof of the inner vacuum chamber.

7. The apparatus according to claim 6, wherein the inner edges of the roof defining the diaphragm opening in a rectangular shape and said inner edges are substantially aligned with inner edges of the electrode, which is in the shape of a rectangle.

8. The apparatus according to claim 7, wherein the electrode further comprises a cooling passage.

9. The apparatus according to claim 6, wherein the apparatus further comprises a deflection magnet means having at least two pole faces disposed on an outer surface of a side wall of the inner chamber for guiding a middle section of the electron beam in a place of symmetry between the pole faces.

* * * * *